United States Patent
Kohli et al.

(10) Patent No.: US 9,691,496 B1
(45) Date of Patent: *Jun. 27, 2017

(54) HIGH DENSITY ROM CELL WITH DUAL BIT STORAGE FOR HIGH SPEED AND LOW VOLTAGE

(71) Applicant: NXP B.V., Eindhoven (NL)

(72) Inventors: Rajat Kohli, New Delhi (IN); Patrick van de Steeg, Oss (NL); Jwalant Kumar Mishra, Bangalore (IN); Pankaj Agarwal, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,194

(22) Filed: Feb. 8, 2016

(51) Int. Cl.
 *G11C 17/00* (2006.01)
 *G11C 17/12* (2006.01)
(52) U.S. Cl.
 CPC .................. *G11C 17/126* (2013.01)
(58) Field of Classification Search
 CPC .................................................. G11C 17/126

USPC ......... 365/104, 51, 54, 63, 94, 96, 103, 102, 365/129, 174, 187, 189.02
See application file for complete search history.

(56) References Cited

U.S. PATENT DOCUMENTS

| | | | |
|---|---|---|---|
| 5,917,224 A | 6/1999 | Zangara | |
| 6,002,607 A | 12/1999 | Dvir | |
| 7,002,827 B1 | 2/2006 | Sabharwal et al. | |
| 8,406,031 B2 | 3/2013 | Buer et al. | |
| 8,422,262 B2 | 4/2013 | Nevers et al. | |
| 9,087,588 B2 | 7/2015 | Kwon | |
| 9,202,588 B1 | 12/2015 | Kohli et al. | |
| 2002/0091894 A1* | 7/2002 | Garg | G11C 17/16 711/103 |
| 2002/0181269 A1 | 12/2002 | Jeung et al. | |
| 2010/0157649 A1 | 6/2010 | Brown | |
| 2011/0267883 A1 | 11/2011 | Lee et al. | |

* cited by examiner

*Primary Examiner* — Fernando Hidalgo

(57) ABSTRACT

Disclosed is a ROM memory including a first bitcell including a transistor to store two bits and first and second bit lines to read data stored in the bitcell, a second bitcell including a second transistor connected to the first transistor and sharing the first and second bit lines, and a virtual ground line adjacent the bit lines configured to ground the bitcells.

18 Claims, 23 Drawing Sheets

HIGH DENSITY ROM CELL WITH DUAL BIT STORAGE FOR HIGH SPEED AND LOW VOLTAGE

TECHNICAL FIELD

Various embodiments disclosed herein relate generally to single transistor read only memory (ROM) bitcells and methods of reading data stored therein.

BACKGROUND

A Mask Read Only Memory (Mask ROM) is a semiconductor memory device in which data is coded during a manufacturing process. There are various types of manufacturing processes to program a Mask ROM such as diffusion, metallization, and via processing. In diffusion processing, a Mask ROM is programmed during a diffusion process in a semiconductor substrate. In an embedded metal programmable ROM, ROM data is programmed during a metal/metallization process. In a via programmable ROM, which is similar to the embedded metal programmable ROM, ROM data code is programmed during a via forming process.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Various embodiments described herein include a ROM memory device, including a first bitcell including a first transistor to store two bits and first and second bit lines to read data stored in the bitcell, a second bitcell including a second transistor connected to the first transistor and sharing the first and second bit lines, and a virtual ground line adjacent the bit lines configured to ground the bitcells.

A virtual ground generation circuit may be configured to control polarities of the bit lines.

The virtual ground generation circuit may toggle the first bit line between a read state and a power state to read data from the second bit line. The virtual ground generation circuit may toggle the second bit line between a read state and a power state to read data from the first bit line.

A source region of the first transistor may be connected to a drain region of the second transistor.

The first bitcell may include a via connected to a bit line and a source or drain region to represent a first logic state.

The first bitcell may include two vias connected to a bit line and a source and drain region to represent a second logic state.

The first bitcell may include no vias connected to a bit line and a source and drain region to represent a second logic state.

Any two of the virtual ground line, first bit line and second bit line may be grounded to read data from a bitcell.

The first bit cell and second bit cell may be read together to produce sixteen different logic combinations.

The transistor may be an NMOS or PMOS transistor.

The device may include a multiplexer wherein logic states read from the bit lines are multiplexed and output as a single bit value.

Various embodiments described herein may also include an article of manufacture including at least one non-transitory, tangible machine readable storage medium containing executable machine instructions for a method of reading a ROM memory device, including instructions for grounding a bit line of a first bitcell, instructions for connecting the bit cell to a virtual ground line, and instructions for reading a stored bit value from a second bit line of the first bitcell.

The instructions may include storing two bits in the first bitcell using a single first transistor.

The article of manufacture of may include instructions for grounding a bit line of a second bit cell, instructions for connecting the second bit cell to the virtual ground line; and instructions for reading a stored bit value from a second bit line of the second bitcell.

The instructions may include storing two bits in the second bitcell using a single second transistor. The instructions may include connecting the first transistor to the second transistor.

The instructions may include grounding the bit line using a virtual ground generation circuit.

Various embodiments described herein may also include an article of manufacture including at least one non-transitory, tangible machine readable storage medium containing executable machine instructions for a method of reading a ROM memory device in which transistors of two bitcells sharing two bit lines and a virtual ground line are connected together, including instructions for grounding any two of the virtual ground line, a first bit line and a second bit line to read data from the bitcells; and instructions for reading logic data from either the first bit line or second bit line according to a bitcell selected to be read by a column multiplexer.

The article of manufacture may include instructions for reading the bit cells together to produce sixteen different logic combinations.

BRIEF DESCRIPTION OF THE DRAWINGS

Embodiments of the invention are described in more detail and by way of non-limiting examples with reference to the accompanying drawings, wherein:

FIG. 6 illustrates a first programming table in accordance with embodiments described herein;

FIG. 11 illustrates a schematic diagram of a column-row configuration in accordance with FIG. 7;

FIG. 16 illustrates a third programming in accordance with embodiments described herein;

DETAILED DESCRIPTION

Figure 1:
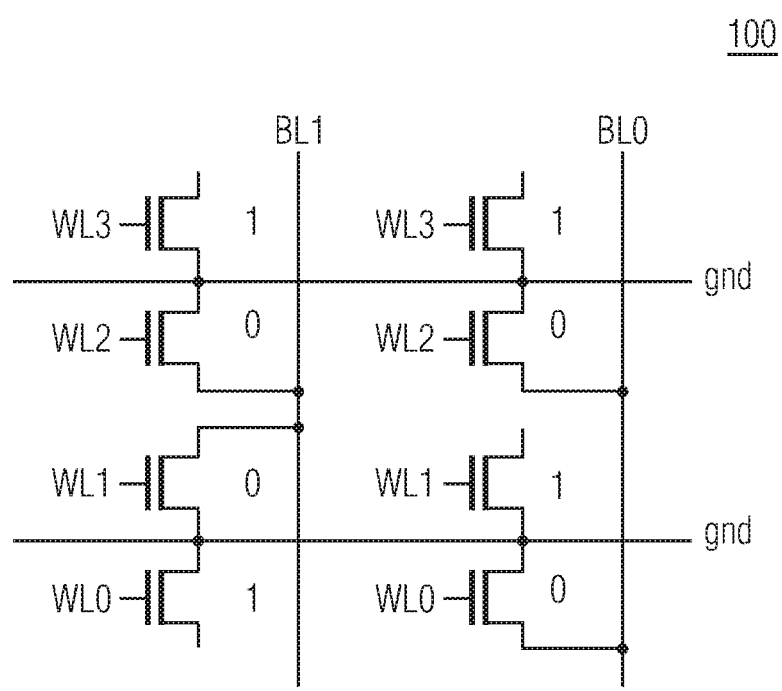
FIG. 1 illustrates a schematic diagram of a related art source-connected NOR type ROM cell.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Designs of single transistor ("1T") ROM bitcells attempt to achieve high quality memory devices while balancing characteristics such as bitcell density, device width, memory speed, and read voltage.

To achieve a high density ROM bitcell array, device width is kept low, usually at the minimum level supported by processing technology. This small width leads to increased spread of a MOS transistor, which can negatively impact the performance (speed) of the memory.

Conversely, for achieving high speed and enhanced low voltage operation (Vddmin), the device width may be kept larger. The larger width reduces the spread of the MOS transistor, which can negatively impact the density of the memory.

It would be advantageous to have a single transistor ("1T") ROM bitcell that can store more data while not increasing the bitcell density nor device width, and still perform at high speed.

A ROM using a 1T cell stores a single bit of data at a time. While using minimum feature sizes is often beneficial, smaller sizes often allow more variation, such as random dopant fluctuations, which can limit low voltage operation.

Related art high density ROM bitcell arrays have columns in which adjacent bitcells are formed to share a source/drain connection and connect to an adjacent bit line or virtual ground line.

FIG. 1 illustrates a schematic diagram of related art source-connected NOR type ROM cell 100. In this figure, a 4×2 array representing four rows of word lines and two columns of bit lines is illustrated in which adequate density of cells is achieved by sharing source nodes and connecting these nodes to ground. When a particular bit line is charged (e.g., BL1) and a particular word line enabled (e.g., WL2), then the transistor located at the intersection of those lines will manifest a logical "0" encoded by its drain connection at BL1. As illustrated, when a drain connection is connected to a BL, logic 0 is read. When there is no drain/BL connection, the drain may float and logic 1 is read on the BL. In this configuration, NMOS width is kept low to achieve a good cell density, but the device manifests slow speed, poor spread and may not be good for low voltage applications There are various ways through which the ground and bit lines can be connected to the bitcell. The ground lines are disposed horizontally and connect each of the source/source terminals of a pair of transistors. A large number of ground lines must be provided, and in order to program the bitcells in this arrangement, a large amount of connections must be made.

When having small dimensions such as with small size transistors illustrated in FIG. 1, any parameters such as current through the device, will lead to high variability. This can mean that robustness will not be maximized, and hinder device performance. The variability is inversely proportional to the square root of the area of the device. Larger devices equate to less variability, reduction of margins, and higher reliability.

Figure 2:
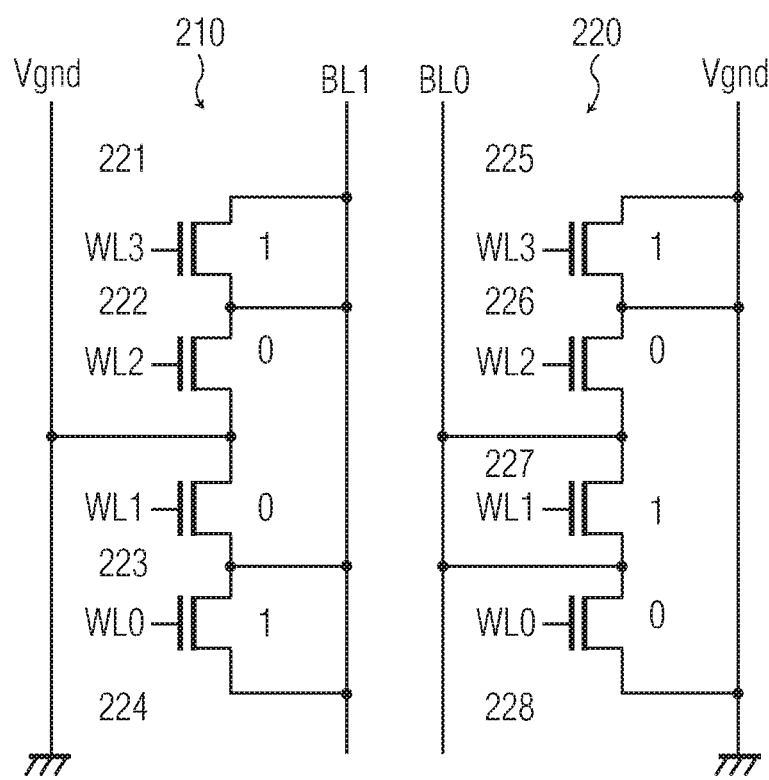
FIG. 2 illustrates a schematic diagram of a related art source and drain connected NOR type ROM cell.

FIG. 2 illustrates a schematic diagram of a related art drain connected NOR type ROM cell 200. As illustrated in FIG. 2, a ROM array is disclosed in which columns of 1T bitcells (210, and 220, for example) each use a separate virtual ground line Vgnd1 and Vgnd2, respectively. Each 1T bitcell stores 1 bit of data. MOS transistors 221, 222, 223 and 224 are disposed in bitcell column 210 and MOS transistors 225, 226, 227 and 228 are disposed in bitcell column 220.

As illustrated in FIG. 2, a high density of bitcells is achieved in the vertical direction because adjacent bitcells in various columns share source or drain (generically referred to herein as "drain") connections. These drain connections connect transistors in various columns to either a virtual ground line or to a bit line associated with that column. A virtual ground line may be disposed between adjacent bit line pairs.

For example the two transistors 226 and 227 of column 220 share a common drain connection and connect to bit line BL0. Transistor 226 shares a drain connection with the transistor 225 and both connect to virtual ground line Vgnd2, while transistor 227 shares a drain connection with the transistor 228 and also connects to bit line BL0.

A transistor, or bitcell, may encode a logical "0" by having one drain connecting to one kind of line (BL and Vgnd) and the second drain connecting to the other BL or Vgnd not connected to the first drain. Conversely, a transistor or bitcell may encode a logical "1" by having both drains connecting to the same kind of line (BL or Vgnd). When a particular bit line is charged (e.g. BL0) and a particular word line enabled (e.g. WL2), the transistor located at the intersection of those lines (in this example transistor 226) will manifest the logical "0" encoded by its drain connections by discharging bit line BL0 onto virtual ground line 2. Conversely if word line WL1 were enabled instead (in order to read transistor 227), significant discharge of the bit line may not occur (both drains of transistor 227 connect to the same BL0 line), indicating a logical "1" encoded by its drain connections. It will be understood that the encoding of "1" and "0" described above is merely a choice and could be inverted.

In the device illustrated in FIG. 2, for a single bitcell, two metal tracks are required over the bitcell. Due to this structure, the NMOS width can be kept high, on the order of about two times the minimum processing width. This structure has a faster operation, reduction of spread, use of lower Vdd, and increased area. Regarding layout, there are various connection layouts to define how bit lines are connected to the bitcell. However, because a column of bit lines uses a separate virtual ground line, the number of tracks is increased and density is compromised. The larger the device, such as illustrated in FIG. 2, the higher the cell current, the faster the device speed. This is especially true for analog devices. Larger devices result in reduced variability.

Embodiments described herein below store two bits of data in one physical width/bit, and thus high density is preserved.

Figure 3:
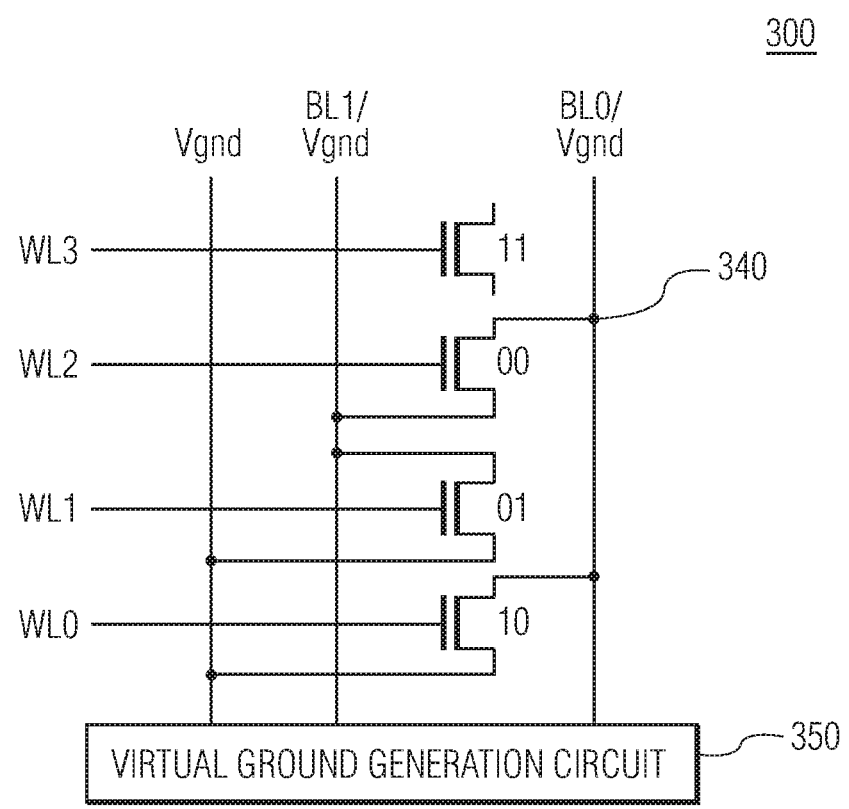
FIG. 3 illustrates a schematic diagram of an NMOS type NOR ROM cell of an embodiment.

FIG. 3 illustrates a schematic diagram of an NMOS type NOR ROM cell 300 of an example embodiment. FIG. 3 illustrates a parallel or NOR type ROM cell using NMOS transistors in a 4×2 data array including four word lines WL0, WL1, WL2, and WL3, two bit lines BL0/Vgnd and BL1/Vgnd, and a dedicated virtual ground line Vgnd. WL0, WL1, WL2, and WL3 are separated by isolation regions (not illustrated). Bit lines BL0/Vgnd and BL1/Vgnd use a virtual ground generation circuit ("VGGC") 350 to control polarities thereof. Though a small array is illustrated here, memory arrays of various sizes may be used, spanning from the hundreds to thousands to millions of transistors to store megabits of data. A column of four bit cells including four transistors are arrayed between BL0/Vgnd and BL1/Vgnd. Each bitcell may be used to store two bits of data using a single MOS transistor.

Four transistors may be connected to BL0/Vgnd, BL1/Vgnd, and a dedicated virtual ground line (Vgnd). In order to conserve space and increase density on a semiconductor chip, bit lines BL0 and BL1 can be used as virtual ground lines at appropriate times to read data from a bitcell. This feature may allow greater versatility of circuit components and provides a new way to read two-bit data stored with a single MOS transistor.

Thus, bit lines BL0/Vgnd and BL1/Vgnd serve multiple purposes. One bit of data may be directly read onto bit lines BL0 or BL1 from a bitcell. Also, polarities of BL0/Vgnd and BL1/Vgnd may be controlled using the VGGC 350 to assist in reading another bit of data from the same bitcell. VGGC 350 may change a bit line's voltage level from a first logic voltage state such as Vdd, to a second logic voltage state such as Vss, upon receiving a read signal. Thus, a bit line of a bit line pair may double as a virtual ground line at an appropriate time determined by the VGGC 350.

The VGGC may also change a bit line's voltage level from a Vss or ground level to a Vdd or powered level, either having a negative or positive voltage. Thus, embodiments of the present disclosure may use NMOS technology as described herein, or PMOS technology with inverted voltage states to perform the same storage and reading capabilities of the memory cells described herein.

In embodiments described herein, a single bitcell is shared between two bit lines. Structurally, with a single bitcell, two metal bit line tracks are required over it. Due to this configuration, the NMOS width can be kept high, on the order of two times the minimum width. This width may allow better device characteristics than smaller devices, such as increased speed, reduced spread, lower Vddmin, and the ability to store more data than devices of the same or similar size.

Figure 5:
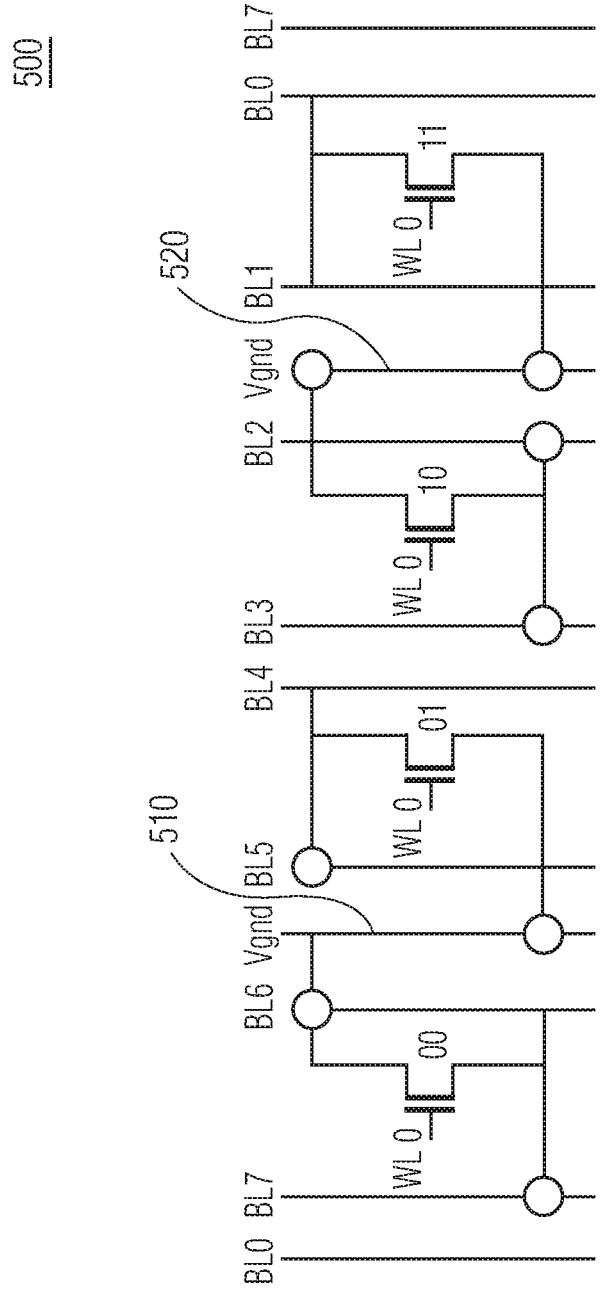
FIG. 5 illustrates a schematic diagram of a column-row configuration in accordance with FIG. 3.

To achieve good density the Vgnd track is shared with an adjacent bitcell column (illustrated in FIG. 5). Using Vgnd and the virtual ground generation circuit 350, one data bit out of the two data bits stored can be read at a time. Differing from related art FIGS. 1 and 2 that use a single bit line per memory cell in a column of memory cells, embodiments described herein use two bit lines in a column to form a memory cell. Though illustrated using NMOS transistors, similar implementations can be performed using PMOS transistors.

FIG. 3 illustrates how 2 bit data is stored in a single ROM cell using the single MOS transistor array 300. The virtual ground generation circuit 350 controls the polarity to be displayed on the three lines Vgnd, BL1/Vgnd and BL0/Vgnd at any given time in order to read a bit. The dots arrayed on BL0, BL1 and Vgnd represent ground-connected vias that have been inserted at a time of forming the given Mask ROM. A via may be a conductive path extending from one or more metallization layers above a substrate into a memory storage part of a semiconductor. In forming memory devices in accordance with embodiments described herein, via holes may be formed to allow conductive connections to be made to bit lines in the memory. When a connection is desired program a bit cell as either a 1 or a 0, a conductive via is made or dropped in the via hole. When no connection is desired to be made, the via hole may be filled with an insulator, covered with an insulator, or left open to signify no connection to a bit line. Vias are dropped in accordance with a predetermined memory pattern and the locations of the vias are likewise stored in the overall system.

When programmed, the system may include various configuration such as a via connected to a bit line and a source or drain region to represent a first logic state. A first bitcell may include two vias connected to a bit line and a source and drain region to represent a second logic state. Alternatively, a first bitcell may include an absence of, or no vias connected to a bit line and a source and drain region to represent a second logic state.

Figure 4:
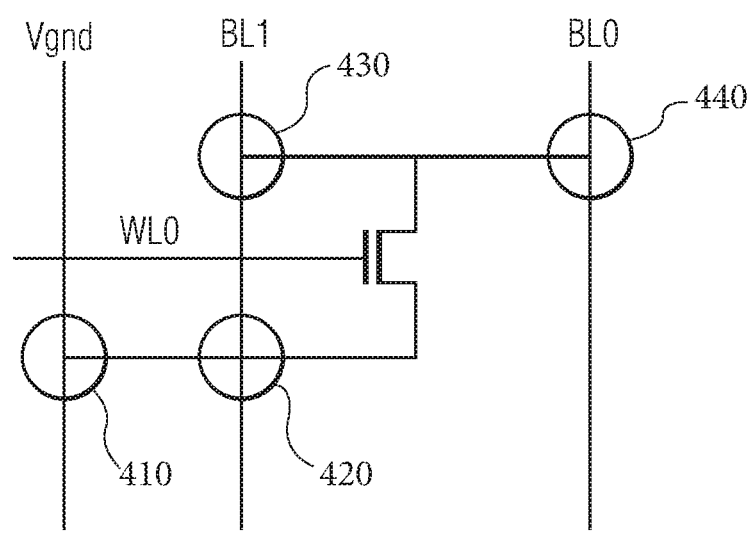
FIG. 4 illustrates a schematic diagram of via connections in accordance with FIG. 3.

Referring to FIGS. 3 and 4, an example explanation will now be given to read the data stored in the memory array 300, for example, to read 00 at WL2. To read 0 on BL0, there is a via on the BL0/Vgnd line connected to ground for the MOS at bitcell 2. To read a data bit from BL0, in addition to the Vgnd line being grounded, BL1/Vgnd may be grounded through VGGC 350 to create a path to ground through the MOS to BL0. To read the second 0 from BL1, the VGGC 350 will short BL0/Vgnd to ground, and because a via ground pad has been inserted to connect to BL1, a second logic 0 can be read at BL1. When the ROM array is initially written, the layout of vias and floating connections is stored, and this layout design is used in conjunction with the VGGC 350 to read from BL0 or BL1 when various bitcell addresses are selected.

With the use of a ROM programming utility, the programming is done at the manufacturing step. A mask is provided based upon the customization strategy. The strategy could be one mask programmable or multiple mask programmable. With the use of software, determinations are made where to land a via and where not to land a via, and that physical mask will be used when the ROM is fabricated, and hence it will be programmed.

To read any combination of two bits using a single MOS, three lines are used, a dedicated virtual ground line that is shared between two columns of bitcells (as illustrated in FIG. 5), a BL1/Vgnd line and a BL0/Vgnd line. BL1/Vgnd line has a dual function as controlled by VGGC 350. BL1/Vgnd can act as BL1 when desiring to read a 0 or 1 on BL1, or BL1/Vgnd can be shorted to virtual ground when desiring to read a 0 or 1 on BL0. BL0/Vgnd line performs a mirrored function for BL0 and BL1.

Previously, reading 00 required two separate WLs for BL1 and BL0, and two bit lines. In embodiments described herein, one MOS transistor is responsible to store 0 for BL1 and 0 for BL0, which is illustrated as 00 in FIG. 3. The first 0 belongs to BL1 and the second 0 belongs to BL0. The other combinations 01, 10, and 11, illustrate that any combination can be stored by appropriately connecting the MOS drain and source, the BL/Vgnds and Virtual Ground 350.

The ROM memory cell 300 will be programmed once using a code. An address may be determined for each bit and vias will be dropped into place wherever a logic 0 is desired to be read. Horizontal lines are representative of metal lines. The dots or nodes 340 represent vias. If the via is illustrated, then it stores a 0. If there is no dot or no via, a logic 1 is stored for a given bit line. The circles are the programmable points. A ROM memory array is originally programmed to represent all 1's. When a via is dropped at a particular location, a logic 0 may be read at that location.

ROM cell 300 stores information in a static format, not in a dynamic format. This means that either a node will be connected to ground, or it will remain floating, as illustrated in FIG. 3. If a drain or source is not connected to a BL, then a "1" polarity of information will be stored. If the drain or source is connected to a BL, then a "0" polarity of information will be stored. In the latter configuration, one of the terminals will be connected to a BL, and the remaining terminal will be connected to ground, so there will be a connection from BL to ground.

In the embodiments described herein, this is done in such a way that two bits of information can be stored on a physical MOS. The polarities of the connections may be alternatively programmed. Instead of a via/ground signifying a logic "0", connecting a bit line to a via/ground could also be programmed to represent a logic "1", while a floating connection could be programmed to represent a logic "0".

FIG. 4 illustrates a schematic diagram of possible via connections in accordance with FIG. 3. One bitcell may store two data bits simultaneously. In embodiments described herein, the Vgnd track may be shared with an adjacent bitcell (as illustrated in FIG. 5). Junctions 410, 420, 430, and 440 illustrate the junctions where a via may be placed (based on the data to be stored) in order to program the ROM content.

Thus, junctions 410, 420, 430, and 440 illustrate nodes where a via may be dropped to indicate a logic 0. To store a connection, a cell programmer will decide whether or not to insert a via at one of these junctions, to represent a logic 0 when read. If no vias are dropped, the unconnected source and drain regions of the NMOS transistor will float and will be read at logic 1.

A via may be inserted on BL1 at 430, for example, along metal line BL1. BL1 will be storing data based on other connections. If a via is dropped at junction 430, either of 410 or 420 will be programmed (have a via). Combinations of 410/420 and 430/440 cannot simultaneously have a via, else a physical short will be created between Vgnd and BL1 or between BL1 and BL0. Each 410/420 or 430/440 pair represents a metal line, and both ends of the metal line cannot have a via at the same time. Any two of the three lines may be grounded at one time in order to read a data bit, and these connections are stored in the VGGC 350.

The VGGC 350 aids in reading the ROM. When reading data stored at BL0, programming logic stored in the VGGC 350 instructs BL1 to be grounded. If a via has been dropped at BL0, the read value will be 0. If no via had been dropped, the read value will be 1. To read data stored at BL1, BL0 will be shorted to ground using the VGGC.

Thus one physical MOS device can be used to store information for two adjacent BLs, and one MOS device can store two bits. To read one BL, the other BL may be grounded by the VGGC 350. Otherwise the bitcell cannot be read. In the related art, additional grounds and vertical lines are required, on alternate BLs. These extra lines increase the amount of area used for the memory devices.

In embodiments described herein, existing BLs are programmed to act as BLs and as virtual grounding lines at different times to maximize space. Additional ground lines are not used and device density is increased. Existing BLs are used as virtual ground circuitry, and the existing bit lines are switched in such a way, when required, that they act as virtual ground and thus eliminate the purpose of having additional virtual ground lines for every bit line column.

FIG. 5 illustrates a schematic diagram of a column-row configuration 500 in accordance with FIG. 3. Illustrated in FIG. 5 is a 1×8 (1 row (WL), 8 columns (BL) of data. As illustrated in FIG. 5, the Vgnd tracks 510 and 520 are respectively shared between two MOS transistors. Thus, bit lines BL0-BL7 can be connected to virtual ground based on the read operation performed on a selected BL. A column multiplexer of 8 is illustrated. One out of eight bit lines is selected at a time to output a bit from memory. Two bit lines are respectively used to form two bits of data. Two bit lines may be referred to as a bit line pair. Memory cells may include a bit line pair and a transistor to store two bits of data therein.

The column as illustrated in FIG. 5 represents a vertical stack of the bitcell laid out in a horizontal fashion. All four cases 00, 01, 10 and 11 are illustrated regarding what connections are used to read two bits of data from a bitcell. As discussed previously, the circuit dot is a via that is inserted during the programming phase of the ROM.

As illustrated in FIG. 5, the BLs that have a via connected to BL2, BL5, BL6 and BL7, representing logic 0 stored. The BLs that do not have a via connected include BL0, BL1, BL3 and BL4, representing logic 1 stored. To read the data stored in one BL, the other BL/Vgnd connection may be shorted with Vgnd as disclosed in embodiments described herein. FIG. 5 illustrates how the connections should look. Based on the connection rules regarding where to place a via as illustrated in FIG. 4 and the programming scheme outlined in Table 1, data stored in a ROM in accordance with embodiments described herein can be read and determined.

Figure 6:
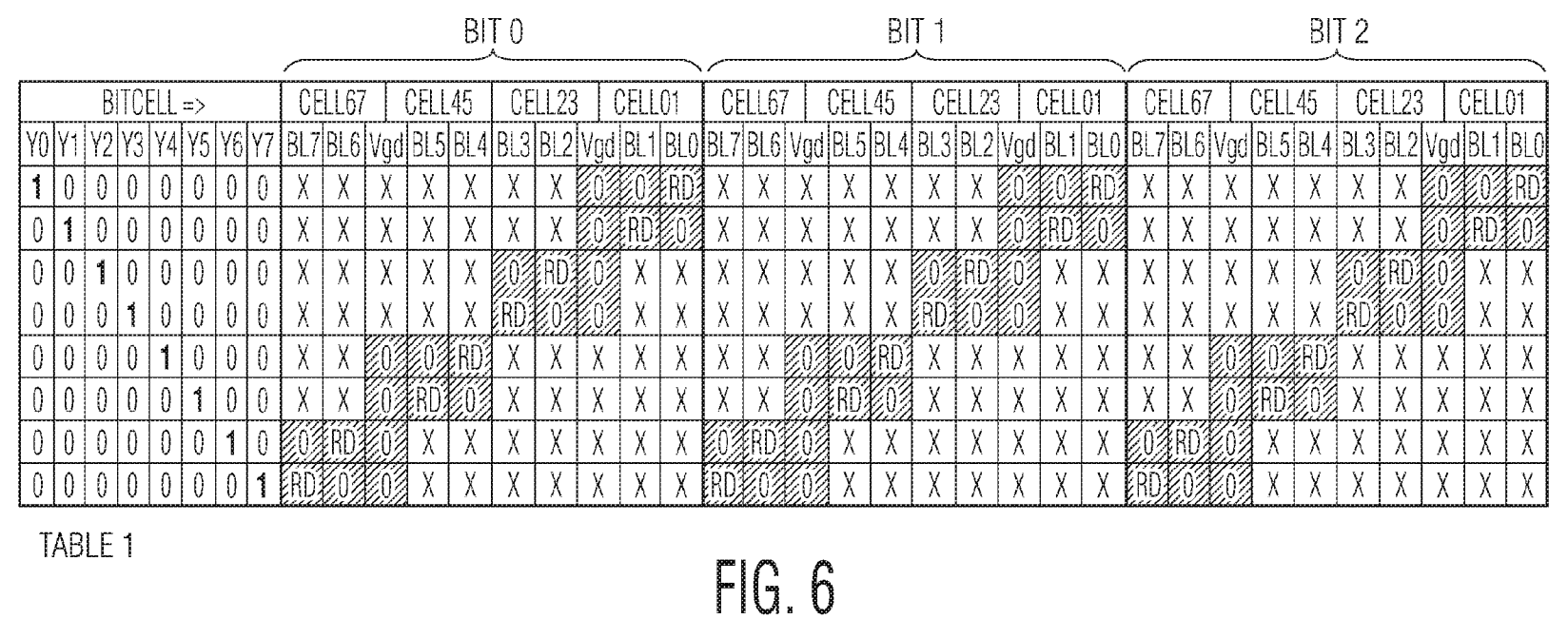

FIG. 6 illustrates a programming Table 1 in accordance with embodiments described herein.

In a read operation, though a bitcell simultaneously stores two bits of data, these two bits may not be read at the same time. To read data stored in the column array of FIG. 5, for example, first the 0 of BL7 is read, then the 0 of BL6 is read, and so on. Externally the read cycle may look like a standard ROM read cycle. Internally, however, data is stored and read in an entirely different fashion that what has heretofore been known in the art.

Table 1 of FIG. 6 illustrates how BL/Vgnd lines and the dedicated Vgnd line should be programmed to read from a bit line in a ROM memory array in accordance with embodiments described herein.

The table illustrates the bitcells to be programmed by the VGGC 350. Y0-Y7 represent addresses output from a column decoder that corresponds to the eight bit lines reading two bits of data from the four bitcells illustrated in FIG. 5. Data from the bitcells may be multiplexed and output to represent various memory bits stored in ROM. Thus a column multiplexer may have a predetermined number of inputs, and a bit line pair and virtual ground line are inputs of the column multiplexer.

Referring to FIGS. 5 and 6, a read signal may be received at WL0 to read the data stored at BL2, for example. BL2 is a data bit associated with bitcell 23 of BIT0. BL2 corresponds to column Y2 decoded by a column decoder (not illustrated). The column decoder receives a read command and accesses column Y2. The address 1 in column Y2 specifies that BL3 and Vgnd may be respectively grounded to read data stored at BL2. RD refers to a read operation on a BL. The output of a RD operation can be a 1 or a 0, depending on how a memory has been programmed. If the memory had been programmed as illustrated in FIG. 5, when the column decoder selects address Y2, because BL2 has a via connected thereto, the logic read there from will be 0, and logic 0 will be read as BIT0 in the memory array.

When Y2=1, the VGGC specifies that BL3 should be grounded. A discharge path is then created through the MOS and the 0 may be read from BL2. The intelligence of Table 1 is programmed into the VGGC, which can be implemented in many ways. When reading the value of a single bitcell, two other bitcells are programmed. The X's in Table 1 represent "do not care" values and have no influence on the read operation. The values of the do not cares can be indiscriminately 0s or 1s and these values do not affect the outcome of the read operations.

The programming of Table 1 repeats itself for every bit series of BL0-BL7, depending on how big a memory is designed to be. The memory is scalable. If there is a column multiplexer decoding of 8, Y0 to Y7 is used. The column decoder can be scaled Y0 to Y3, Y0 to Y15 or Y0 to Y31, and so on. There is no limit on the size of the memory.

FIGS. 5 and 6 thus illustrate a repetition of three conductive lines. Two BL/Vgnds and one dedicated ground line are inserted between each column of bitcells. In column decoding, the desire is to select one BL out of eight BLs, and there is multiplexing inside a memory which has eight lines. If Y4 is high, a read operation will be performed on BL4, which will bring the output of BL4 to 1, which is BIT0. BIT0 can thus have eight addresses, for example, and data can be stored in that bit. When Y0=1, there is one data bit being read from BIT0. When Y1=1, another data value is read, and so on. Thus, eight different data values can be read from BIT0 based on the column decoding.

As discussed herein, and illustrated in FIG. 6, the read schemes depend on the programming of neighboring BLs to a selected BL. For example when reading column Y2, BL2 from bitcell 23 is being read. Logic 0 is read, which means the virtual ground circuitry has to make sure that the other lines from cell 23 are correctly polarized as BL3=0 and Vgnd=0. Table 1 thus illustrates the dependency relationships of the three lines. When reading from BL3 in bitcell 23, corresponding to column Y3, BL3 is being read, thus BL2 and Vgnd are pulled to ground. Thus, BITs 0, 1, 2, etc. can be programmed 0 or 1 based on the RD square in Table 1. The table shows what the condition for the neighboring lines should be.

This read scheme can be implemented in various circuit designs as are known to those skilled in the art. A particular circuit design is not illustrated here. Table 1 is provided to demonstrate what current values should be associated with each line. Thus implementations of embodiments are described at the technology level, but not at the implementation level. Those having ordinary skill in the art may implement the embodiments described herein using various types of circuits.

Figure 7A:
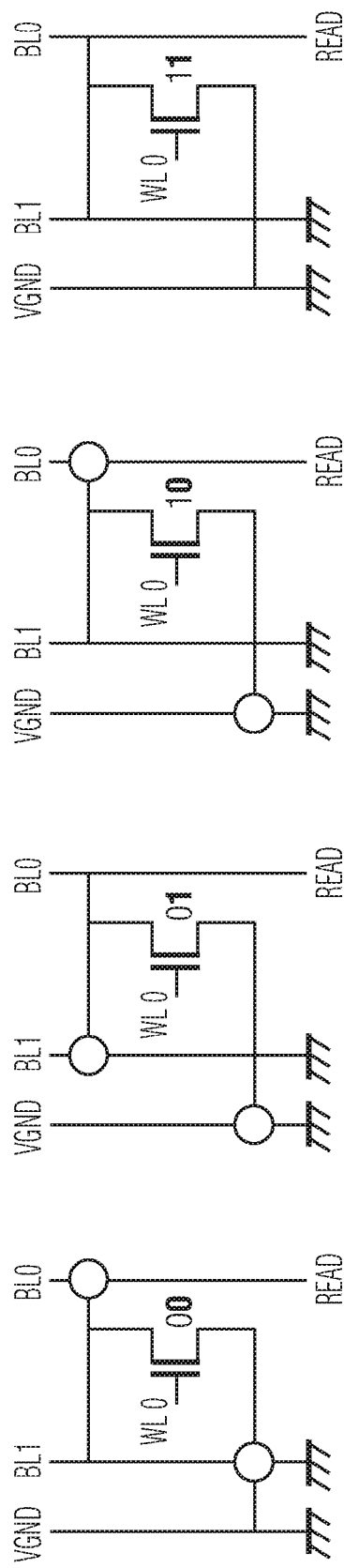
FIGS. 7A and 7B illustrate schematic diagrams of different read configurations in accordance with FIG. 3.
Figure 7B:
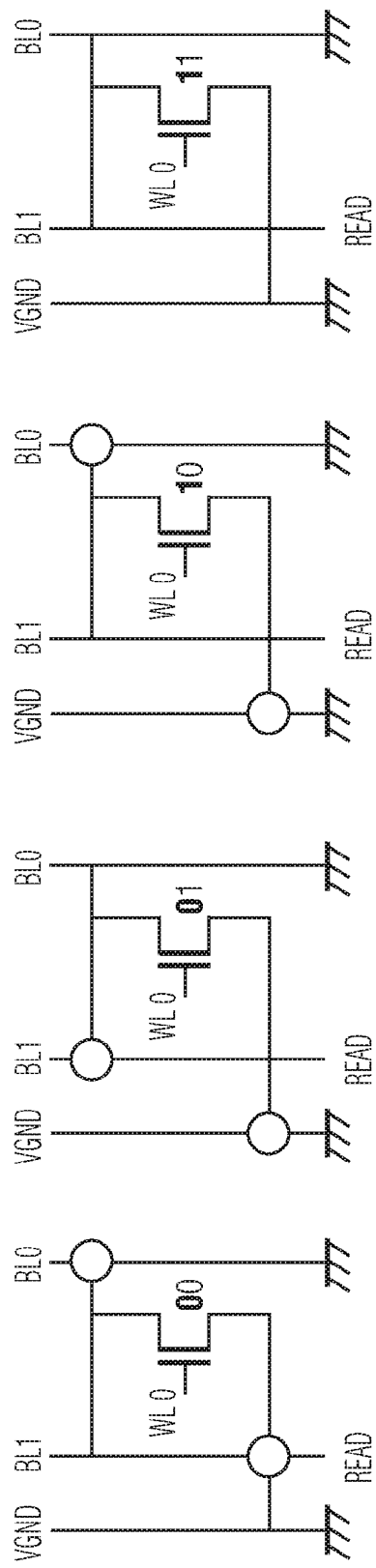

FIGS. 7A and 7B illustrate schematic diagrams of different read configurations in accordance with FIG. 3. FIGS. 7A and 7B illustrate various possible combinations of data which can be stored in a bitcell, and how each 0 or 1 bit is read. To understand what is being illustrated, a "read" label is placed below each bit being read. A via connected to a bit line being read represents a logic 0. No via or a floating connection at a bit line being read represents a logic 1. This is not an actual column array representation, but illustrates all possible combinations of data that can be stored and read.

Figure 8:
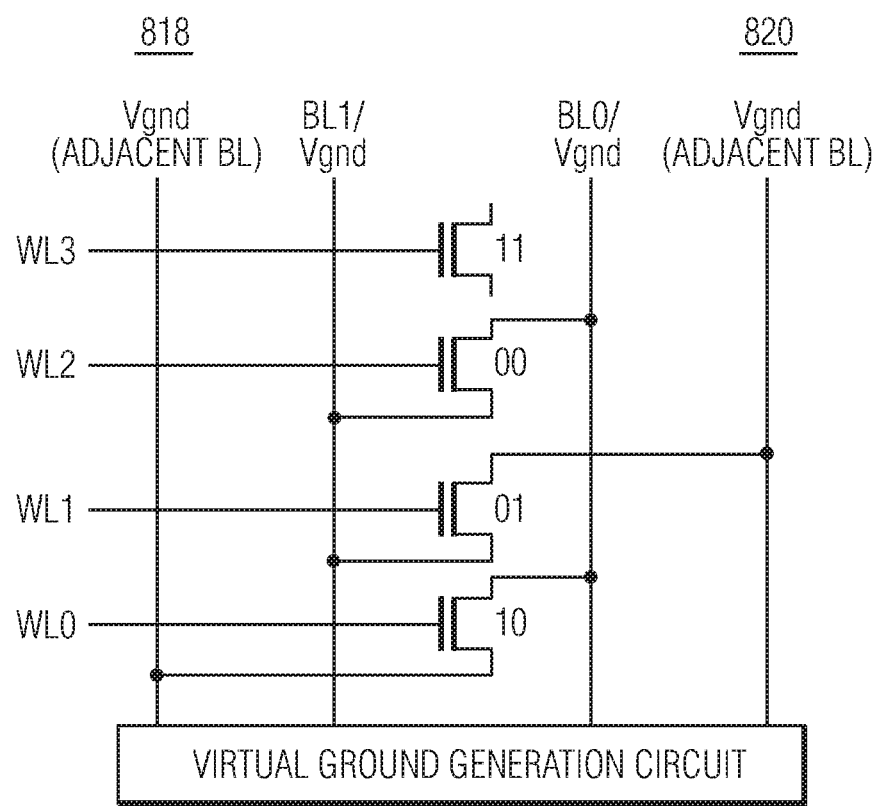
FIG. 8 illustrates a schematic diagram of a NOR type ROM cell using bit lines in accordance with a further embodiment.

FIG. 8 illustrates a schematic diagram of a NOR type ROM cell using bit lines in accordance with a further embodiment. Illustrated in FIG. 8 is a parallel or NOR type ROM cell in a 4×2 data array implementation. A bitcell column is shared between two bit lines BL0/Vgnd and BL1/Vgnd. For a single bitcell two metal tracks (bit lines) are required over it. Due to this configuration the NMOS width can be kept high, greater than two times the minimum width.

In this embodiment, to achieve good density, the Vgnd tracks 810 and 820 are not dedicated Vgnd lines, but are formed with bitlines of adjacent bitcells. All of the Vgnd connections are made with existing bit lines. In this arrangement, one extra track per column multiplexer decoder is required. Though NMOS transistors are used and displayed, similar implementations can be done using PMOS transistors. Benefits of the bitcell configuration illustrated in FIG. 8 are faster speed, reduced spread, lower Vddmin and comparable area with respect to embodiments described herein. In embodiments described herein, a plurality of column multiplexers may be implemented having a plurality of rows and columns of memory cells.

Figure 9:
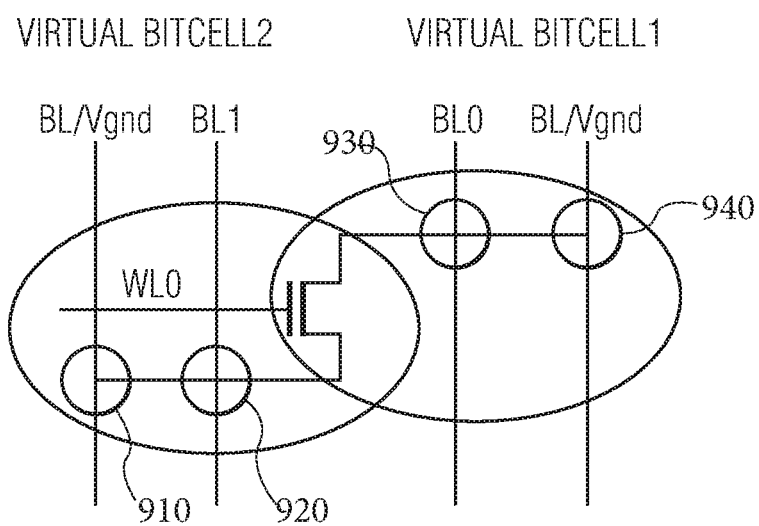
FIG. 9 illustrates a schematic diagram of via connections in accordance with FIG. 7.

FIG. 9 illustrates a schematic diagram of via connections in accordance with FIG. 8. FIG. 9 illustrates the layout correspondence of various nodes. One bitcell stores two data simultaneously. Vgnd may be generated using the adjacent bit lines which are not being read. Junctions 910-940 shows the junctions where a via placed (based on the data to be stored) in order to program the ROM content. Junctions 930 and 940 cannot be programmed at the same time and junctions 910 and 920 cannot be programmed at the same time, else data cannot be read. When reading from BL0, BL1 may be grounded to Vgnd by the VGGC. When read from BL1, BL0 and BL/Vgnd on right side may be grounded to Vgnd by the VGGC.

Figure 10:
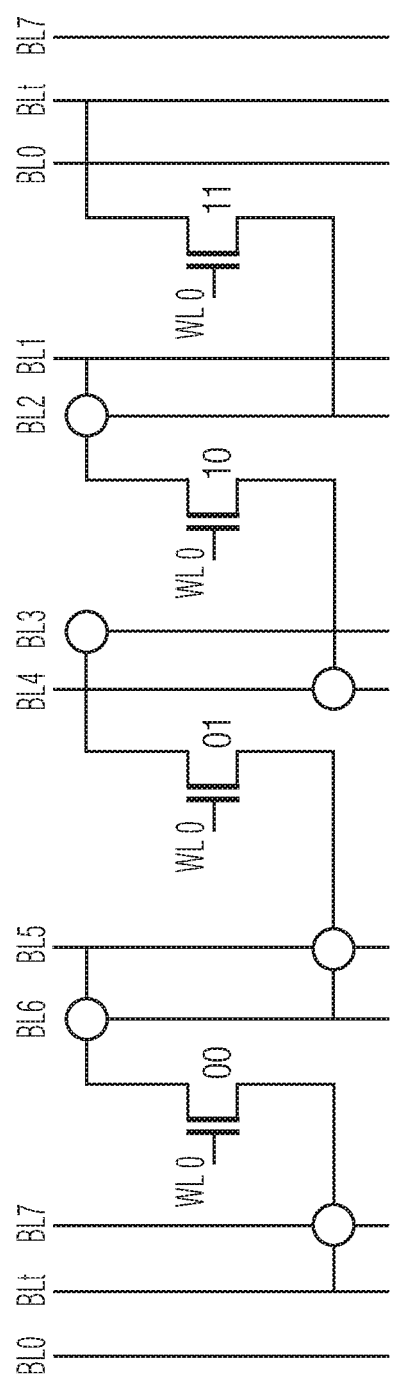
FIG. 10 illustrates a second programming table in accordance with embodiments described herein.

FIG. 10 illustrates a schematic diagram of a column-row configuration in accordance with FIG. 8. In this embodiment, BL0 and BL1 are read in a similar manner as previously described. One difference is that the virtual ground track on a left and right of a BL pair is taken from the existing cell bit lines.

FIG. 10 illustrates a practical implementation of the connections described regarding FIG. 9. Reading 00, two vias are placed at BL6 and BL7. To read BL7, BL6 may be grounded, and thus a via is formed at BL7. In the previous embodiment, after every two bit lines, a virtual ground line was required. Here, that line is not present. The drain connection gets a virtual ground connection from the existing BLS, if required, as illustrated in Table 2.

FIG. 10 illustrates a programming Table 2 in accordance with embodiments described herein.

In a previous embodiment illustrated in FIG. 3 for example, a bit line could represent either a bit line or a virtual ground line, and there was a dedicated virtual ground line. In this embodiment, three bit lines are taken as virtual ground connections and data is read from a fourth BL. In this embodiment there is not a requirement to lay down an extra ground track.

For example, in a read operation on BL5, BL3 and BL4 are grounded by the VGGC. Similarly, to read BL4, BL5 and BL6 are virtually grounded. This is another difference from a previous embodiment. In this case, two different BLs should be grounded, instead of a bit line and Vgnd.

As illustrated in FIG. 10, implementation of an embodiment corresponds to 1×8 (1 row (WL), 8 cols (BL)) data, in which 1 out of 8 bit lines will be selected, and data 00, 01, 10, 11 can be stored in the manner illustrated herein. In this embodiment, one extra track (BLt) is required at end of a column multiplexer. As described above, BL0 to BL7 are connected to virtual ground based on the read operation performed on a selected bit line.

Figure 11:
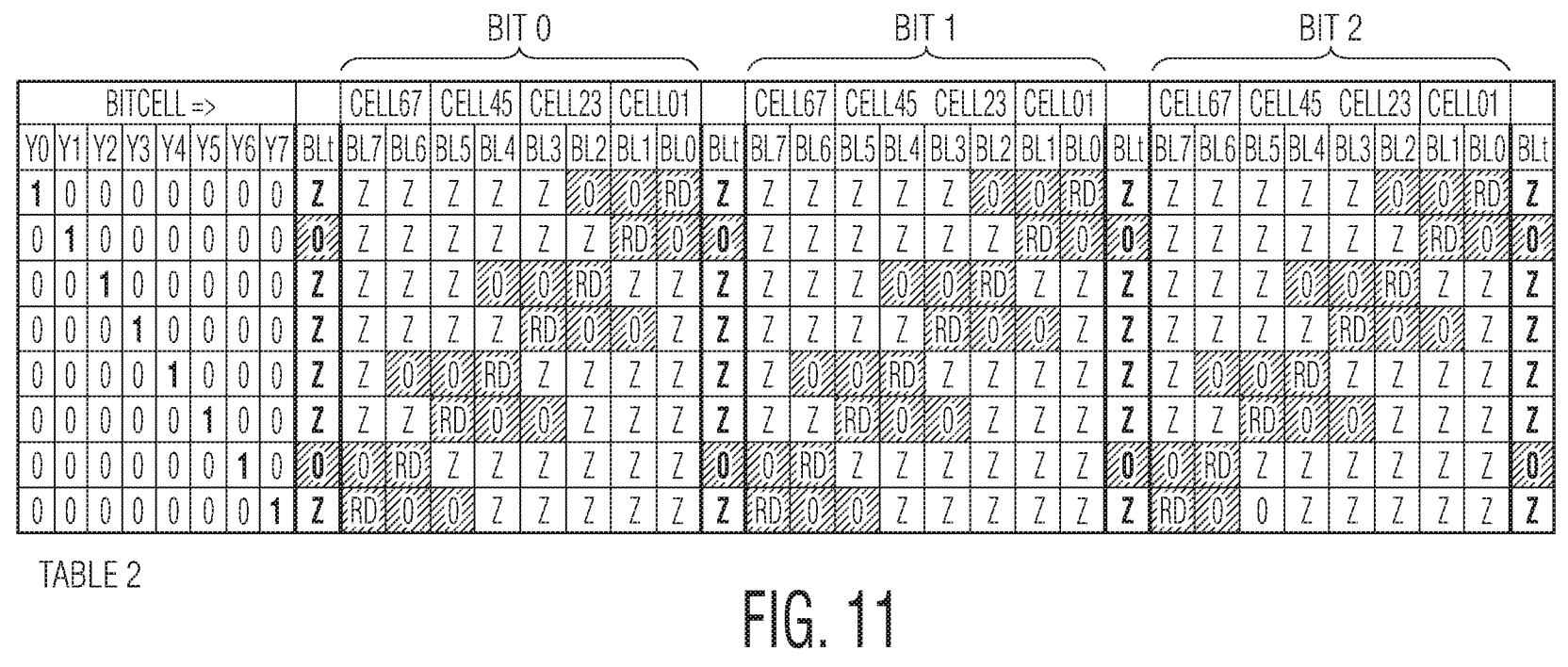

FIG. 11 illustrates a programming Table 2 in accordance with embodiments described herein. As a bitcell is capable of storing two data bits, there can be four possible combinations stored, i.e. 00, 01, 10, and 11. The data stored in a bitcell is also dependent on the generation of virtual ground on the required bit lines as illustrated in Table 2. Remaining bit lines are kept at high impedance conditions during read operations as shown in Table 2.

The case shown is for NMOS implementations of a bitcell. Similar implementation can be done for PMOS type of column multiplexer of 8 is illustrated, with Y0 to Y7 being addresses decoded from a column decoder. A three bit scenario is shown including BIT0, BIT1, and BIT2. RD represents read operation on the bit lines. Z represents a high impedance state in case of an NMOS type ROM bitcell implementation.

In this embodiment, one extra track per column multiplexer is required (BLt track as shown in FIG. 10 and Table 2) in order to avoid logical conflicts due to a path created to virtual ground. This extra track has an additional advantage in that a horizontal connection may not cross the bit boundary. Detailed programming of various data stored inside the bitcell is discussed herein.

Although generally a high impedance state is required where shown, regarding table 2, the Z content is not mandatory and some of the Z data shown can be made 0 (for particular Y values) without affecting the operation of bitcell. The minimum requirement is shown here.

As illustrated in FIGS. 10 and 11, in order to read BL0, BL1 and BL2 have to be grounded. In combination with this, a third bit line track, Blt is used to isolate two bits, BIT0 and BIT1. Different from Table 1, the do not care X values become Z. Z means that the previous "do not care" tracks should not be driven through any signal, they may be made to float via the VGGC.

Reading data in this embodiment is different than in other embodiments. In this embodiment, the VGGC has to ensure that the remaining BL remains in the high impedance state rather than weekly driven by parasitics, thus not driven. If driven, the desired BL to be read will store the wrong data. Apart from that, another track may be present vertically after every 8 BLs, or 16 BLs, depending on the scaling, in order to not scale incorrect data. In previous embodiments, an additional track was not present.

When performing a read operation on BL1, for example, the VGGC may ensure that on the other side of BL0 and Blt track should be zero, to read a correct zero. To read from any one BL, three ground connections may be made. In this embodiment, none of these ground connections are a dedicated ground of Vgnd line. Two bitcells may be read using a single MOS transistor using all bit line tracks to read from the bitcells, with the neighboring columns being kept at ground or a high impedance state based on the programming associated with Table 2 illustrated in FIG. 11.

Figure 12A:
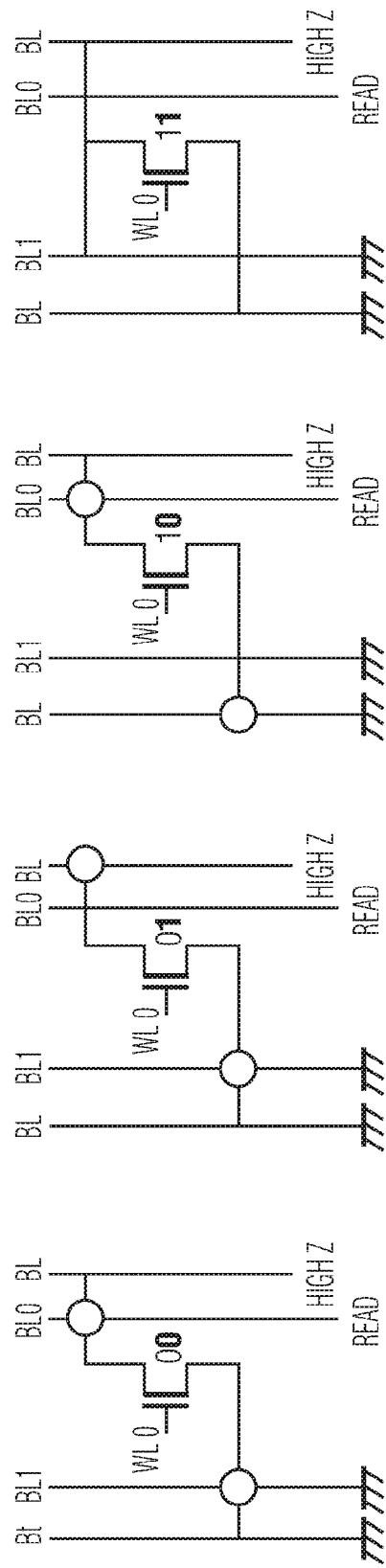
FIGS. 12A and 12B illustrate schematic diagrams of different read configurations in accordance with FIG. 7.
Figure 12B:
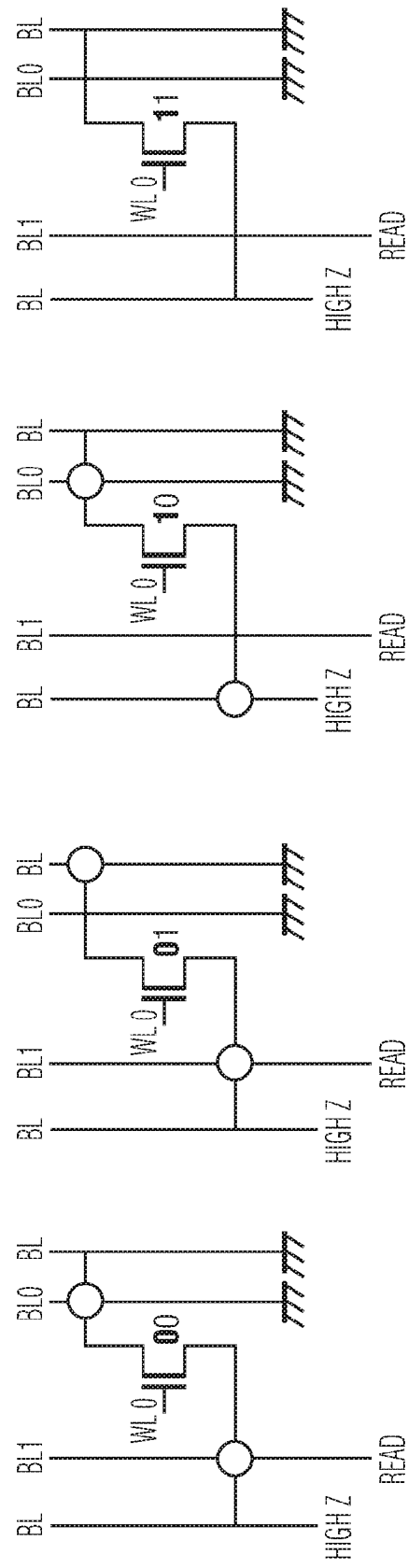

FIGS. 12A and 12B illustrate schematic diagrams of different read configurations in accordance with FIG. 8. These figures illustrate various possible combinations of data which can be stored in bitcell. This is a representation of a single bitcell that can store two data as shown next to the MOS. The data being read is shown in bold.

For example, reading the bit BL0 at 00, BL1 and BL (left) may be grounded, and BL (right) may be at a high impedance state Z. The high Z will be programmed with the VGGC. Care may be taken that BL (right) is not being driven through any MOS transistor, so as not to negatively affect the outcome.

Comparisons were performed with the parallel bitcells illustrated in FIGS. 1 and 2 and further embodiments described herein.

Figure 13:
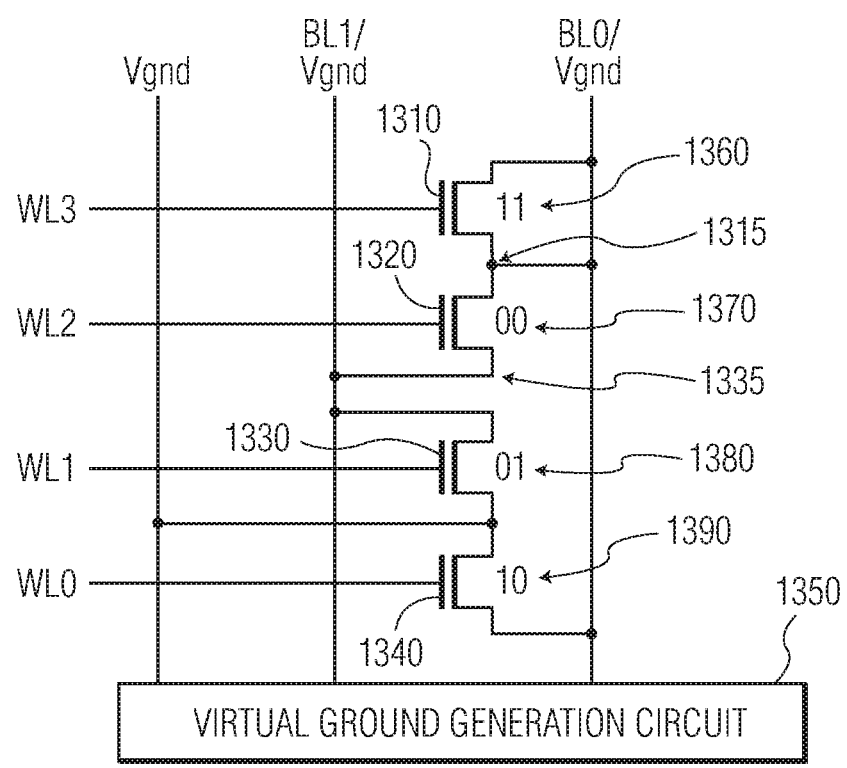
FIG. 13 illustrates a schematic diagram of an NMOS type NOR ROM cell in accordance with embodiments described herein.

FIG. 13 illustrates a schematic diagram of an NMOS type NOR ROM cell 300 of another embodiment. FIG. 13 illustrates a parallel or NOR type ROM cell using NMOS transistors in a 4×2 data array including four word lines WL0, WL1, WL2, and WL3, two bit lines BL0/Vgnd and BL1/Vgnd, and a dedicated virtual ground line Vgnd. Transistors 1310 and 1320 share a drain connection. Transistors 1330 and 1340 also share a drain connection. This arrangement can eliminate isolation regions between devices that may allow more transistors, and thus memory cells, to fit in a given active area.

In an embodiment, bit cells may be connected vertically to form two rows in addition to the horizontally connected bit cells that share two bits per transistor or bit cell. The horizontal arrangement, as described herein, permits the transistor to be made wider, and the amount of statistical spread may be kept under control. The vertical and horizontal designs together increase the device dimensioning capabilities.

Embodiments described herein include a total diffusion capacitance being decreased from the sharing of two source/drain regions of two transistors. The bit line capacitance in a vertical direction is also decreased at a percentage of thirteen percent from configurations in which the source/drain regions are not connected. The reduction in bit line capacitance leads to a reduction in access time to read data therefrom because the discharge time is proportional to bit line capacitance and also leads to reduction in power consumption.

In embodiments described herein, a single bitcell is shared between two bit lines. Structurally, with a single bitcell, two metal bit line tracks and a virtual ground line are required over it. Due to this configuration, the NMOS width can be kept high, on the order of three times the minimum width. This width allows better device characteristics than smaller devices, such as increased speed, reduced spread, lower Vddmin, and the ability to store more data than devices of the same or similar size.

Bit lines BL0/Vgnd and BL1/Vgnd use a virtual ground generation circuit ("VGGC") 1350 to control polarities of the bit lines. Though a small array is illustrated here, memory arrays of various sizes may be used, spanning from the hundreds to thousands to millions of transistors to store megabits of data. A column of four bit cells including the four transistors 1310-1340 are arrayed between BL0/Vgnd and BL1/Vgnd. A bitcell may be used to store two bits of data using a single MOS transistor. A single bit cell may include a transistor and two bit lines. In FIG. 13, bit cells 1360, 1370, 1380 and 1390 are illustrated.

Bit lines BL0/Vgnd and BL1/Vgnd serve multiple purposes. One bit of data may be stored into and read from bit lines BL0 or BL1 of a bitcell. Also, polarities of BL0/Vgnd and BL1/Vgnd may be controlled using the VGGC 1350 to assist in reading another bit of data from the same bitcell. VGGC 1350 may change a bit line's voltage level from a first logic voltage state such as Vdd, to a second logic voltage state such as Vss, upon receiving a read signal. Thus, a bit line of a bit line pair may double as a virtual ground line at an appropriate time as determined by the VGGC 1350.

Figure 14:
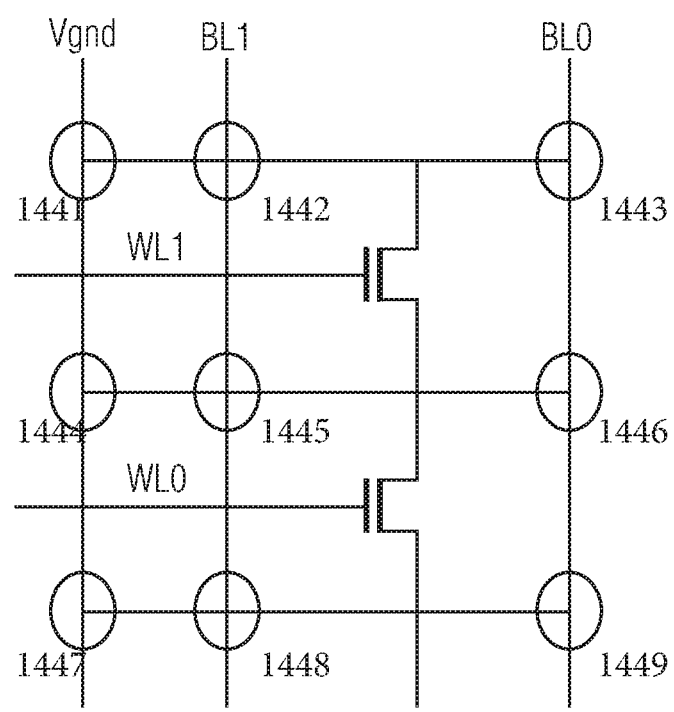
FIG. 14 illustrates a schematic diagram of possible via connections in accordance with FIG. 13.
Figure 15:
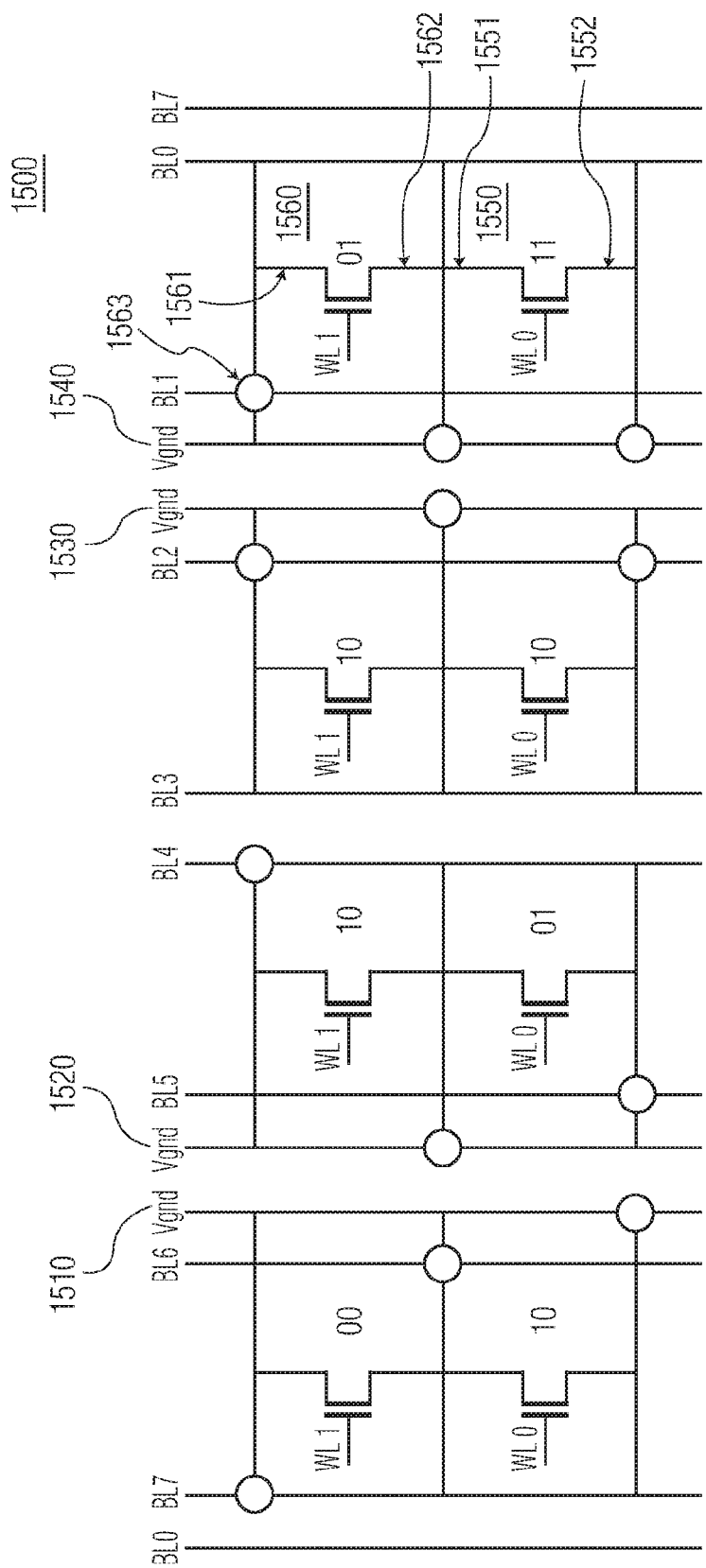
FIG. 15 illustrates a schematic diagram of a column-row configuration in accordance with FIG. 13.
Figure 17A:
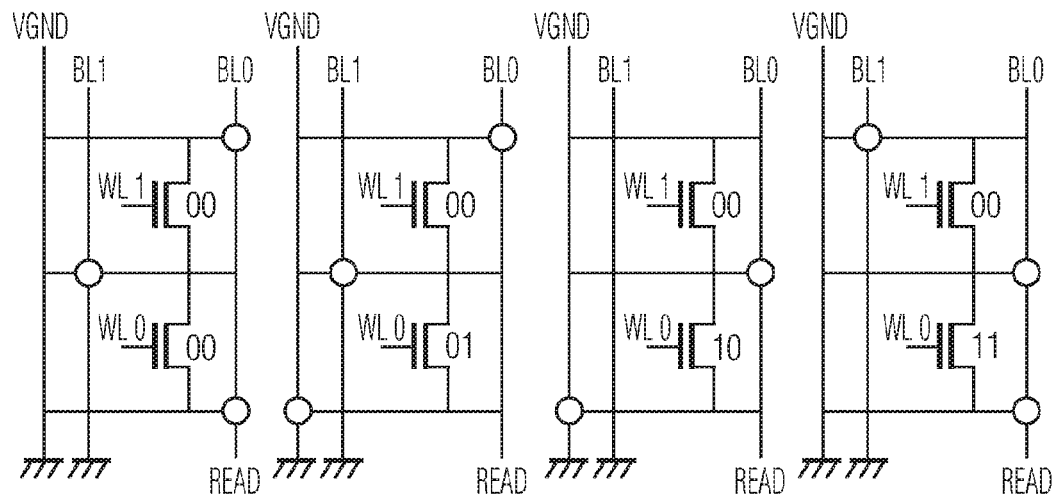
FIGS. 17A-17D illustrate schematic diagrams of different read configurations for WL0 in accordance with FIG. 13.
Figure 17B:
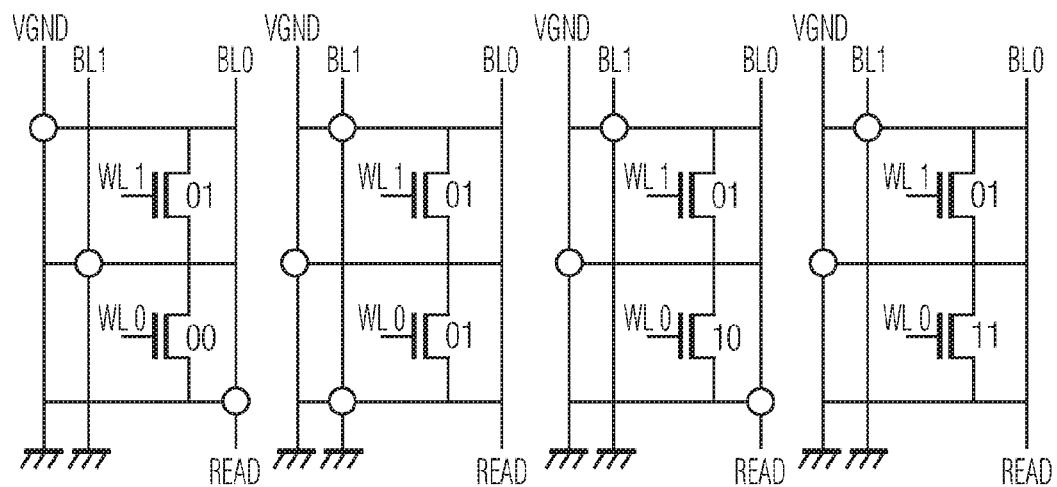
Figure 17C:
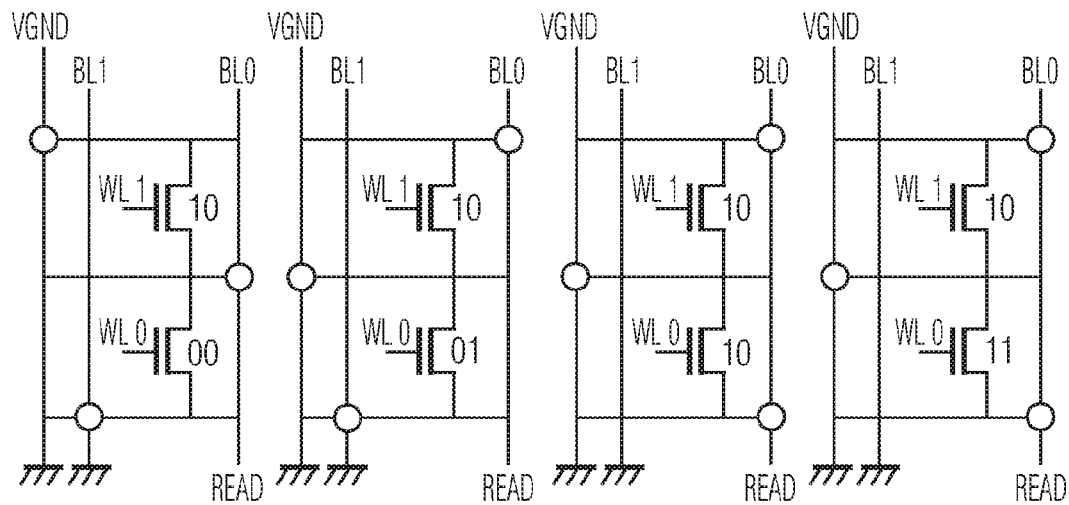
Figure 17D:
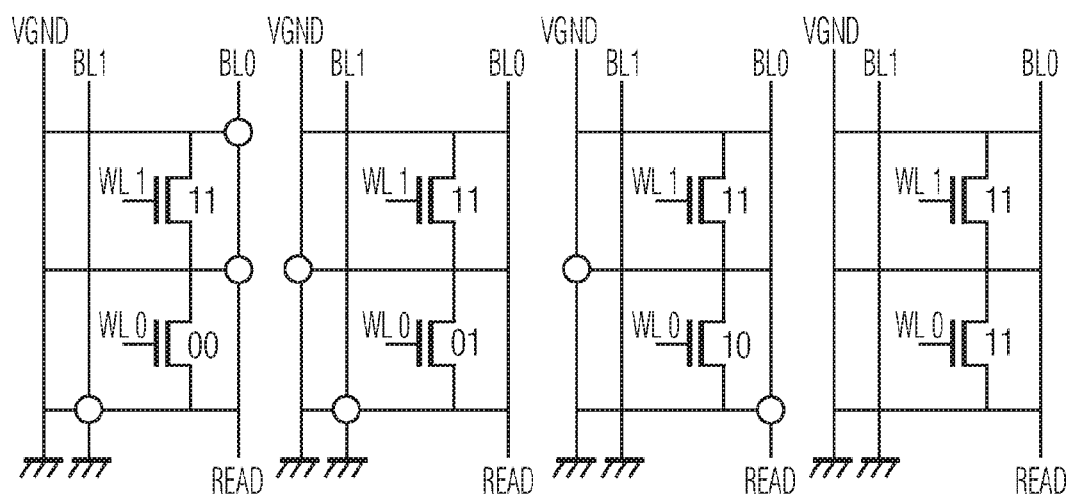
Figure 18A:
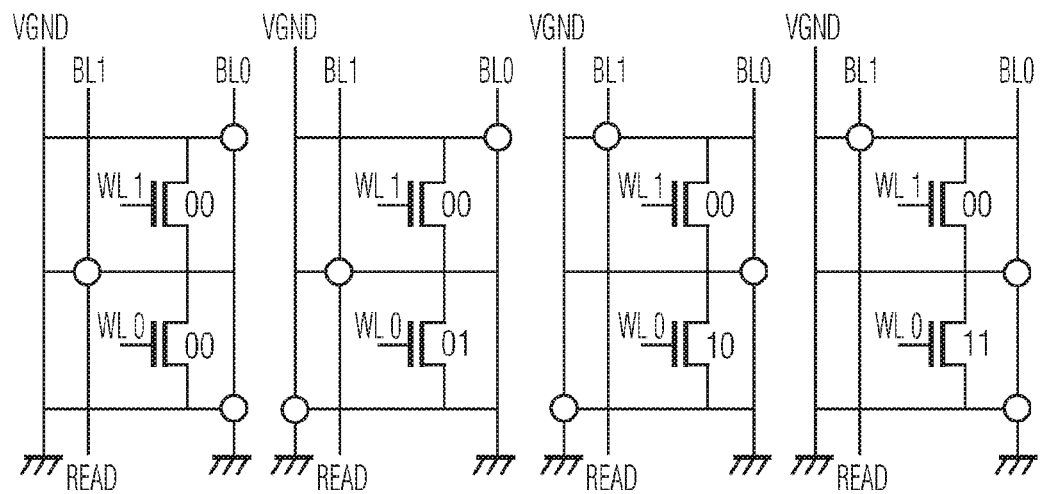
FIGS. 18A-18D illustrate schematic diagrams of different read configurations for WL1 in accordance with FIG. 13.
Figure 18B:
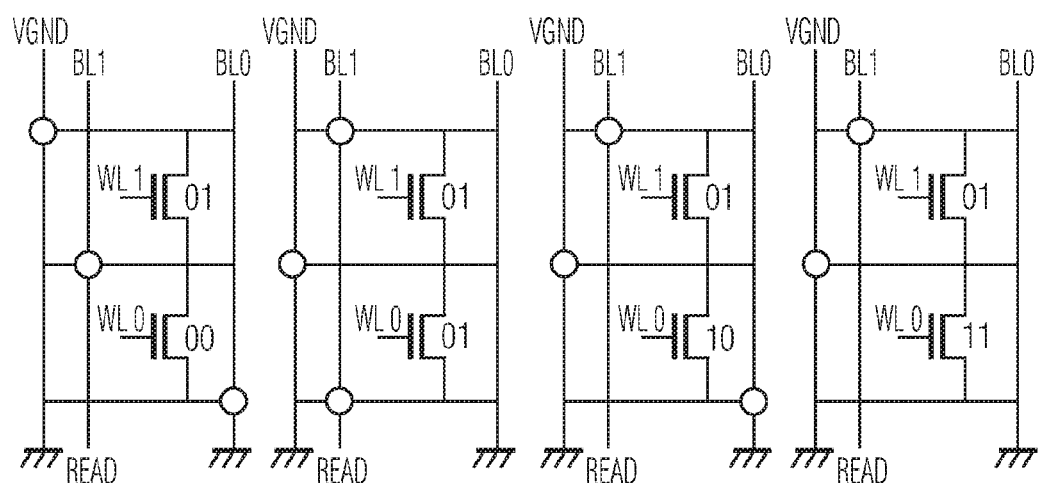
Figure 18C:
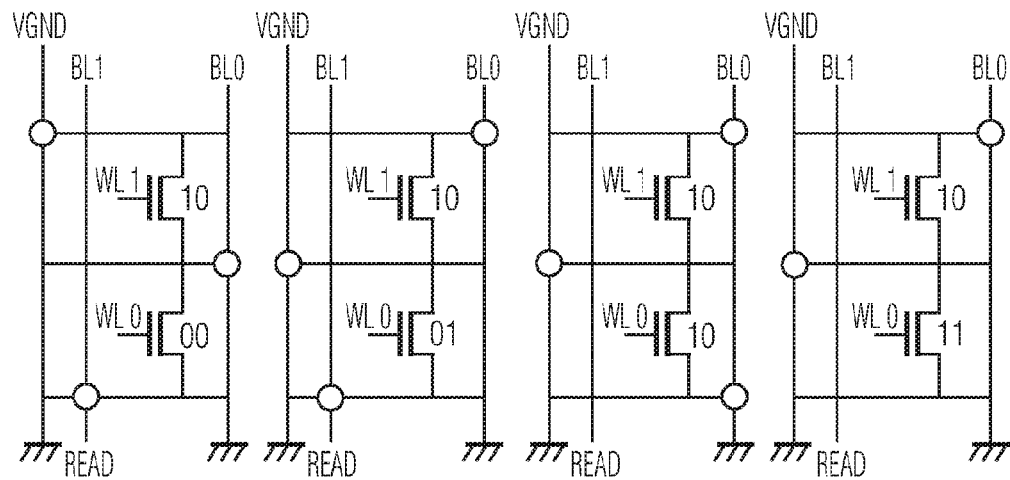
Figure 18D:
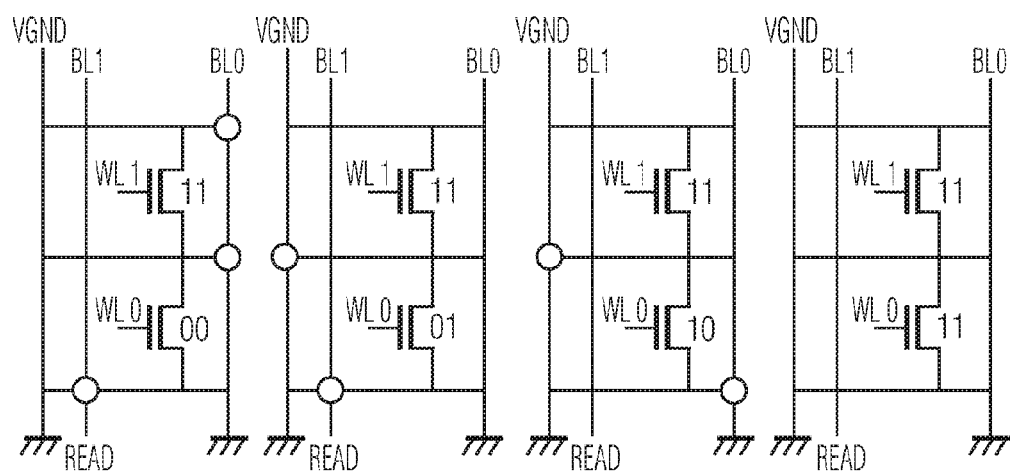

To achieve good density, adjacent bit cells share a common drain and these adjacent bit cells can be vertically connected (illustrated in FIGS. 14 and 15). Using Vgnd and the VGCC 1350, in a single bitcell one data bit out of the two data bits stored can be read at a time. Differing from related art FIGS. 1 and 2 that use a single bit line per memory cell in a column of memory cells, embodiments described herein use two bit lines in a column to form a memory cell. Though illustrated using NMOS transistors, similar implementations can be performed using PMOS transistors. As described herein, when voltages are described or required for NMOS implementation, PMOS similar configurations may be implemented with inverted voltage states.

FIG. 13 illustrates how 2 bits of data are stored in a single ROM cell using the single MOS transistor array 1300. The virtual ground generation circuit 1350 controls the polarity to be displayed on the three lines Vgnd, BL1/Vgnd and BL0/Vgnd at any given time in order to read a bit. The dots arrayed on BL0, BL1 and Vgnd represent ground-connected vias that have been inserted at a time of forming the given Mask ROM.

Referring to FIGS. 13 and 14, an example explanation will now be given to read the data stored in the memory array 1300, for example, to read 00 at WL2. To read the first 0 on BL0, there is a via placed on the BL0/Vgnd line connected to the upper drain/source 1315 for the MOS 1320 at bitcell 1370. To read a data bit from BL0, in addition to the Vgnd line being grounded, BL1/Vgnd may be grounded through VGGC 1350 to create a path to ground through the MOS 1320 to BL0. To read the second 0 from BL1, the VGGC 1350 will pull BL0/Vgnd to ground. Because a via 1325 is placed to connect to the drain/source 1315 for the MOS 1320 at bitcell 1370 to BL0, and there is no connection between drain/source 1335 and BL0/Vgnd, a second logic 0 can be read at BL1. When the ROM array is initially written, the layout of vias and floating connections is stored, and this layout design is used in conjunction with the VGGC 1350 to read from BL0 or BL1 when various bitcell addresses are selected. A ROM programming utility can be used to program the device as described herein.

Figure 16:
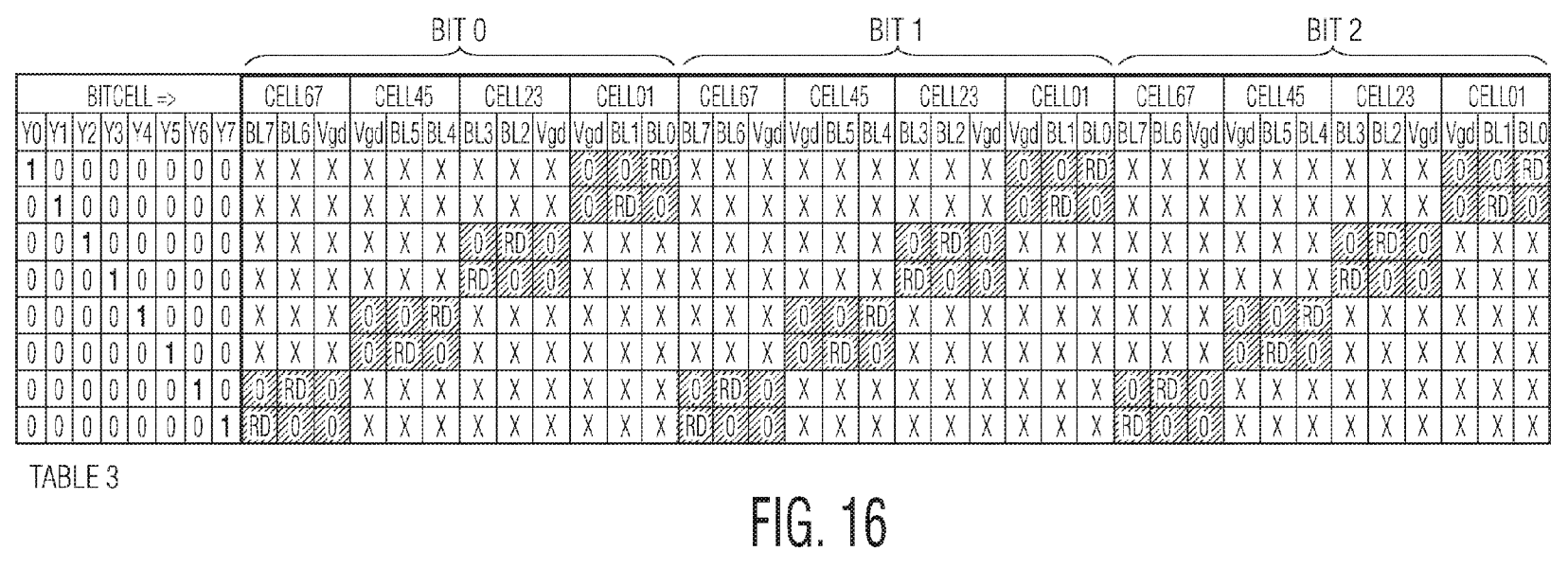

To read any combination of two bits using a single MOS, three lines are used, a dedicated virtual ground line for a bit cell (as illustrated in FIGS. 15 and 16), a BL1/Vgnd line and a BL0/Vgnd line. BL1/Vgnd line has a dual function as controlled by VGGC 1350. BL1/Vgnd can act as BL1 when desiring to read a 0 or 1 on BL1, or BL1/Vgnd can be shorted to virtual ground when desiring to read a 0 or 1 on BL0. BL0/Vgnd line performs a mirrored function for BL0 and BL1.

In embodiments described herein, one MOS transistor may store 0 for BL1 and 0 for BL0, which is illustrated as 00 for bitline 1370 in FIG. 13. The first 0 belongs to BL1 and the second 0 belongs to BL0. The other combinations 01, 10, and 11, illustrate that any combination can be stored by appropriately connecting the MOS drain and source, the BL/Vgnds and Virtual Ground 1350. The ROM memory cell 1300 can be programmed in a similar manner to ROM memory cell 300 discussed herein. ROM cell 1300 stores information in a static format in a similar manner to ROM memory cell 300 discussed herein.

In the embodiments described herein, two bits of information can be stored on a physical MOS. The polarities of the connections may be alternatively programmed. Instead of a via/ground signifying a logic "0", connecting a bit line to a via/ground could also be programmed to represent a logic "1", while a floating connection could be programmed to represent a logic "0". A floating bitline can be encoded by connecting source/drain of a bitcell using a via to the same BL/Vgnd. Thus a logic 0 may not be tied to the presence of a via. Therefore, the encoding of the memory cells described herein can be inverted logically.

FIG. 14 illustrates a schematic diagram of possible via connections in accordance with FIG. 13. One bitcell may store two data bits simultaneously. In embodiments described herein, a bitcell has a dedicated Vgnd line (as illustrated in FIGS. 15 and 16). Junctions 1441-1449 illustrate the junctions where a via may be placed (based on the data to be stored) to program the ROM content. For any program of a bitcell, a subset of junctions 1441-1449 will be used to program four bits within the vertical bitcell.

Thus, junctions 1441-1449 illustrate nodes where a via may be placed to indicate a logic as illustrated in FIGS. 17 and 18. To store data, a cell programmer will decide whether to insert a via at one of these junctions, to represent the correct logic state when read.

A via may be inserted on BL1 at 1442, for example, along metal line BL1. BL1 will be storing data based on other connections. If a via is dropped at junction 1442, either of 1444 or J5 or J6 will be programmed (have a via). Nodes on the same horizontal line may not have a via at the same time. Thus, Either 1441 or 1442 or 1443 will have a via, but any two may not be programmed at the same time, else a physical short will be created between Vgnd and BL1 or between BL1 and BL0. The same holds true for 1444-1446 and 1447-1449. Each 1441/1442/1443 or similar set represents a metal line, and both multiple points of the metal line cannot have a via at the same time. Any two of the three lines may be grounded at one time to read a data bit, and these connections are stored in the VGGC 1350.

Thus one physical MOS device can be used to store information for two adjacent BLs, and one MOS device can store two bits. To read one BL, the other BL may be grounded by the VGGC 1350. Otherwise the bitcell may not be read. In the related art, additional grounds and vertical lines are required, in an alternating BL fashion. These extra lines increase the amount of area used for the memory devices.

In embodiments described herein, existing BLs are programmed to act as BLs and as virtual grounding lines at different times to optimize space. Transistor pair drains are connected together and a bitcell uses a dedicated Vgnd line. Device density is increased. Existing BLs are used as virtual ground circuitry, and the existing bit lines are switched in such a way, when required, that they act as virtual ground and thus eliminate the purpose of having additional virtual ground lines for bit line columns.

FIG. 15 illustrates a schematic diagram of column-row configuration 1500 in accordance with FIG. 13. Illustrated in FIG. 15 is a 2×8 (2 rows (WL), 8 columns (BL)) bits of data.

As illustrated in FIG. 15, the Vgnd tracks 1510, 1520, 1530 and 1540 are dedicated Vgnd lines for a vertical pair of MOS transistors. The positioning of Vgnd lines 1510, 1520, 1530 and 1540 are not limited to the placements shown, and may be placed in various configurations, such as shown in FIGS. 17A-D or other configurations depending on design and device effects of a circuit designer.

Thus, bit lines BL0-BL7 can separately be connected to virtual ground based on the read operation performed on a selected BL. An eight column multiplexer case is illustrated, and four bits of data may be stored in a WL pair. Thus, any pair of bitcells is able to represent 16 different combinations of bits, as will be described herein.

The grid as illustrated in FIG. 17 represents a vertical stack of the bitcell laid out in a horizontal fashion. Sixteen possible four-bit sequences 0000, 0001, 0010, 0011, 0100, 0101, 0110, 0111, 1000, 1001, 1010, 1011, 1100, 1101, 1110 and 1111 may be stored and read. As discussed previously, the circuit dot is a via that is inserted during the programming phase of the ROM.

To read data from a bitcell, the connections at a source and drain node are evaluated. To read from a bit line, an opposing bit line is grounded by the VGGC 1350 in addition to the dedicated Vgnd line, and then the via placements are examined for the BL to be read. If the source (or drain) is connected to a BL and drain (or source) is connected either to a adjacent BL/Vgnd or Vgnd line thus a ground path exists a logic 0 is read. All other cases are read as logic 1.

Reading bitcell 1560 for example, at BL0. Grounding Vgnd and BL1, looking at the source 1561 and drain 1562 connections of BL0, at WL1 in this instance. Since there are no vias connected between source 1561 or drain 1562 nodes along BL0, there is no path to ground, thus a logic 1 is read for BL0 at bitcell 1560. The same is true to read logic 1 at bit cell 1550.

To read the logic 0 at BL1 of WL1, BL0 and Vgnd are grounded by the VGGC 1350. Along BL1 there is a single via 1563 dropped at the source 1561, and the drain 1562 of the MOS is connected to Vgnd, and thus there is a path to ground and a logic 0 is read at BL1. The bitcell connected to WL0 can similarly be used to store two bits, one at BL0 and a second at BL1. At bitcell 1550 along BL1, grounding BL0 and Vgnd, there are no vias connected to source 1551 or drain 1552, thus no path to ground, and a logic 1 is read at BL1 for bitcell 1550.

Depending on placements and non-placements of vias, sixteen different bit combinations can be made for the vertical pair of bitcells using two transistors. Based on the connection rules regarding where to place a via as illustrated in FIGS. 14, 17 and 18 and the programming scheme outlined in Table 3 discussed herein, data stored in a ROM in accordance with embodiments described herein can be read and determined.

FIG. 16 illustrates a programming Table 3 in accordance with embodiments described herein. Table 3 operates in a similar manner to Tables 1 and 2 described herein, and is not described herein.

FIGS. 17A-17D illustrate schematic diagrams of different read configurations in accordance with FIG. 13, and how example ones of eight bits can be read for BL0. FIGS. 18A-18D illustrate possible storage combinations for BL1.

As illustrated in FIGS. 17A-17D, 18A-18D, the programming is exemplary and not exhaustive for vias or non-placement of vias to program the bitcells. FIGS. 17A-17D, 18A-18D illustrate various possible combinations of data which can be stored in a bitcell, and how a 0 or 1 bit is read. To understand what is being illustrated, a "read" label is placed below a bit being read. This is not an actual column array representation, but illustrates possible combinations of data that can be stored and read.

Figure 19:
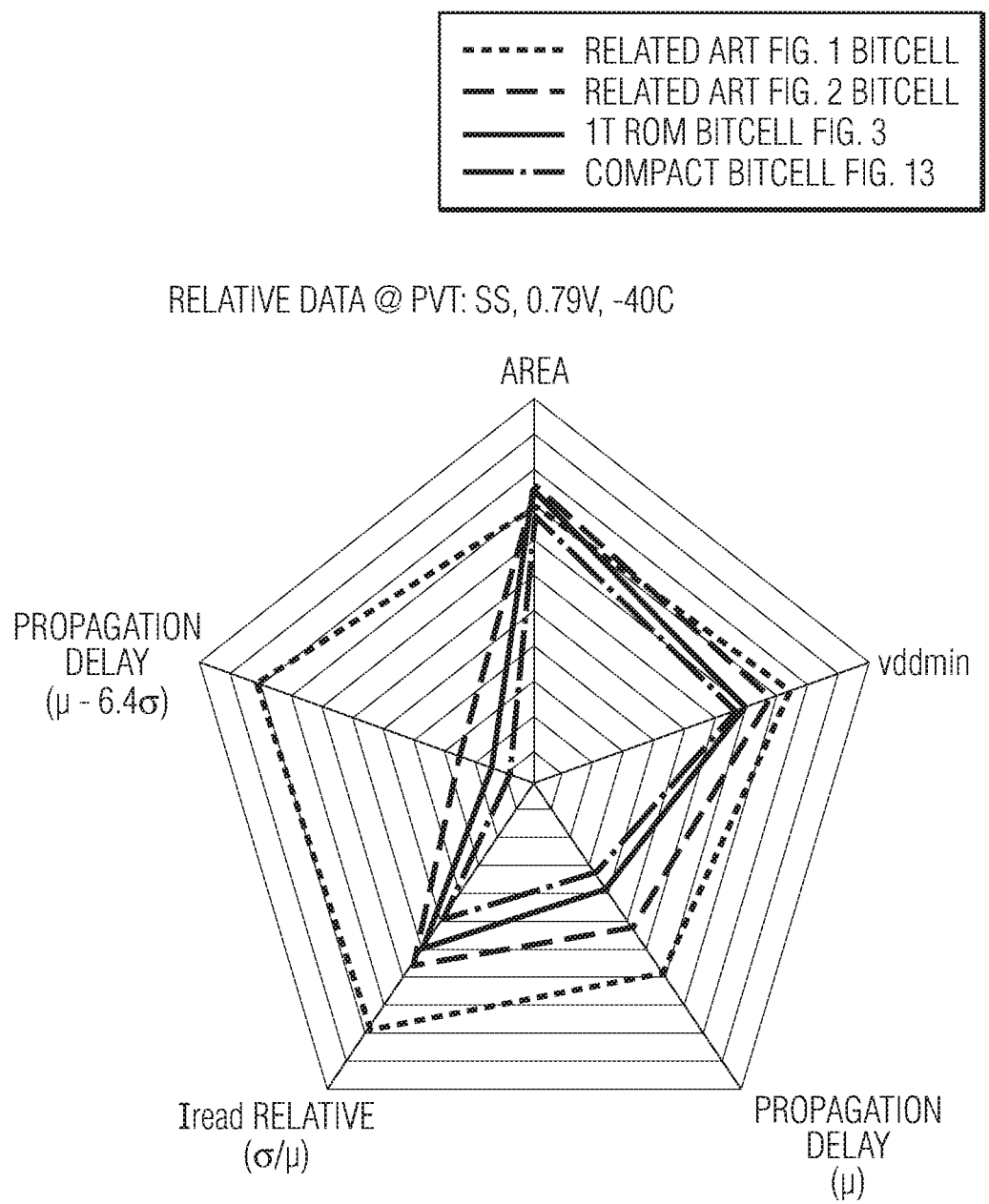
FIG. 19 illustrates a pentagonal graph comparing device parameters in accordance with embodiments described herein.

FIG. 19 illustrates a pentagonal graph comparing device parameters of related art FIG. 1, related art FIG. 2, the 1T ROM bitcell of FIGS. 3 and 8, and the vertical ROM bitcell of FIG. 13 in accordance with embodiments described herein. In the graph, comparisons were measured and are displayed to compare propagation delay, cell current, spread ON current, area and Vddmin. Smaller values represent better characteristics of the device. Regarding embodiments that store two bits per transistor described herein, all of the characteristics are improved. Read current is a characteristic for a ROM bitcell. High current drives a high speed device, which may allow voltage levels to be kept down. In embodiments described herein, a same read current may be obtained that was previously obtained at higher voltages. The horizontally merged bitcell transistors may allow the bitcell transistors to be very strong, providing additional cell current.

Thus in embodiments described herein, by using a bigger cell, memory reliability is significantly increased, speed is increased, and variability is reduced. Minimum channel width is not being implemented for the ROM in embodiments described herein. Size can be around two times larger than the minimum channel width that processing technology uses. Though the size may be larger, there is little sacrifice in area, because two bits of information are being stored on one physical MOS.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware including several distinct elements. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. A ROM memory device, comprising:
 a first bitcell including a first transistor, the first bitcell to store two bits of data and first and second bit lines to read data stored in the bitcell;
 a second bitcell including a second transistor connected to the first transistor and sharing the first and second bit lines, the second bitcell to store two bits of data;
 a virtual ground line adjacent the bit lines configured to ground the bitcells; and
 a virtual ground generation circuit configured to control polarities of the bit lines, the virtual ground generation circuit toggles the first bit line between a read state and a power state to read data from the second bit line.

2. The device of claim 1, wherein a source region of the first transistor is connected to a drain region of the second transistor.

3. The device of claim 1, wherein the first bitcell comprises a via connected to a bit line and a source or drain region to represent a first logic state.

4. The device of claim 1, wherein the first bitcell comprises two vias connected to a bit line and a source and drain region to represent a second logic state.

5. The device of claim 1, wherein the first bitcell comprises no vias connected to a bit line and a source and drain region to represent a second logic state.

6. The device of claim 1, wherein any of the first bit line and second bit line are grounded to read data from a bitcell.

7. The device of claim 1, wherein the first bit cell and second bit cell are read together to produce sixteen different logic combinations.

8. The device of claim 1, wherein the first and second transistor is an NMOS or PMOS transistor.

9. The device of claim 1, comprising a multiplexer wherein logic states read from the bit lines are multiplexed and output as a single bit value.

10. A ROM memory device, comprising:
a first bitcell including a first transistor, the first bitcell to store two bits of data and first and second bit lines to read data stored in the bitcell;
a second bitcell including a second transistor connected to the first transistor and sharing the first and second bit lines, the second bitcell to store two bits of data;
a virtual ground line adjacent the bit lines configured to ground the bitcells; and
a virtual ground generation circuit configured to control polarities of the bit lines, the virtual ground generation circuit toggles the second bit line between a read state and a power state to read data from the first bit line.

11. The device of claim 10, wherein a source region of the first transistor is connected to a drain region of the second transistor.

12. The device of claim 10, wherein the first bitcell comprises a via connected to a bit line and a source or drain region to represent a first logic state.

13. The device of claim 10, wherein the first bitcell comprises two vias connected to a bit line and a source and drain region to represent a second logic state.

14. The device of claim 10, wherein the first bitcell comprises no vias connected to a bit line and a source and drain region to represent a second logic state.

15. The device of claim 10, wherein any of the first bit line and second bit line are grounded to read data from a bitcell.

16. The device of claim 10, wherein the first bit cell and second bit cell are read together to produce sixteen different logic combinations.

17. The device of claim 10, wherein the transistor is an NMOS or PMOS transistor.

18. The device of claim 10, comprising a multiplexer wherein logic states read from the bit lines are multiplexed and output as a single bit value.

* * * * *